(12) United States Patent
Tak et al.

(10) Patent No.: US 10,784,405 B2
(45) Date of Patent: Sep. 22, 2020

(54) SEMICONDUCTOR LIGHT EMITTING DEVICE

(71) Applicant: Samsung Electronics Co., Ltd., Suwon-si, Gyeonggi-do (KR)

(72) Inventors: Young Jo Tak, Seongnam-si (KR); Sam Mook Kang, Hwaseong-si (KR); Mi Hyun Kim, Seoul (KR); Joo Sung Kim, Seongnam-si (KR); Young Hwan Park, Yongin-si (KR); Jong Uk Seo, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/038,368

(22) Filed: Jul. 18, 2018

(65) Prior Publication Data

US 2019/0189848 A1 Jun. 20, 2019

(30) Foreign Application Priority Data

Dec. 19, 2017 (KR) .......................... 10-2017-0175434

(51) Int. Cl.
| | | |
|---|---|---|
| H01L 33/32 | (2010.01) | |
| H01L 33/12 | (2010.01) | |
| H01L 33/04 | (2010.01) | |
| H01L 33/20 | (2010.01) | |
| H01L 33/40 | (2010.01) | |
| H01L 33/10 | (2010.01) | |

(52) U.S. Cl.
CPC .............. *H01L 33/32* (2013.01); *H01L 33/04* (2013.01); *H01L 33/10* (2013.01); *H01L 33/12* (2013.01); *H01L 33/20* (2013.01); *H01L 33/405* (2013.01)

(58) Field of Classification Search
CPC ............................................... H01L 33/38–382
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |

(Continued)

FOREIGN PATENT DOCUMENTS

| | | |
|---|---|---|
| KR | 10-2012-0031340 A | 4/2012 |
| KR | 10-2012-0055332 A | 5/2012 |

*Primary Examiner* — Alia Sabur

(74) *Attorney, Agent, or Firm* — Lee IP Law, P.C.

(57) ABSTRACT

A semiconductor light emitting device includes a light emitting stack including a first conductive semiconductor layer, an active layer, and a second conductive semiconductor layer, a plurality of holes through the second conductive semiconductor layer and the active layer, a trench extending along an edge of the light emitting stack, the trench extending through the second conductive semiconductor layer and the active layer, and a reflective metal layer within the plurality of holes and within the trench.

15 Claims, 17 Drawing Sheets

(56) References Cited

U.S. PATENT DOCUMENTS

| | | | |
|---|---|---|---|
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,564,009 B2 | 10/2013 | Min |
| 8,735,931 B2 | 5/2014 | Han et al. |
| 8,766,295 B2 | 7/2014 | Kim |
| 9,117,986 B2 | 8/2015 | Choi et al. |
| 9,680,050 B2 | 6/2017 | Choi et al. |
| 2014/0045284 A1 | 2/2014 | Tak et al. |
| 2016/0240759 A1* | 8/2016 | Chae ............... H01L 33/36 |
| 2017/0222107 A1 | 8/2017 | Chen et al. |
| 2018/0219133 A1* | 8/2018 | Park ............... H01L 33/46 |

\* cited by examiner

SEMICONDUCTOR LIGHT EMITTING DEVICE

CROSS-REFERENCE TO RELATED APPLICATION

Korean Patent Application No. 10-2017-0175434, filed on Dec. 19, 2017 in the Korean Intellectual Property Office, and entitled: "Semiconductor Light Emitting Device," is incorporated by reference herein in its entirety.

BACKGROUND

1. Field

Embodiments relate to a semiconductor light emitting device.

2. Description of the Related Art

Semiconductor light emitting devices have come to prominence as next-generation light sources due to advantages thereof, e.g., relatively long lifespans, low power consumption, fast response speeds, low environmental impact, and the like. Semiconductor light emitting devices are attracting attention as important light sources in various types of products, e.g., lighting devices and display backlights. For example, a nitride-based light emitting device based on a Group III nitride, e.g., GaN, AlGaN, InGaN, or InAlGaN, may serve an important function in outputting blue or ultraviolet light as a semiconductor light emitting device. Recently, ultraviolet (UV) light sources have been used in devices for various purposes, e.g., sterilization and disinfection equipment, UV curing devices, and the like.

SUMMARY

According to an embodiment, a semiconductor light emitting device may include a light emitting stack including a first conductive semiconductor layer, an active layer, and a second conductive semiconductor layer, a plurality of holes passing through the second conductive semiconductor layer and the active layer, a trench extending along an edge of the light emitting stack, and passing through the second conductive semiconductor layer and the active layer, and a reflective metal layer disposed within the plurality of holes and within the trench.

According to an embodiment, a semiconductor light emitting device may include a light emitting stack including a first conductive semiconductor layer, an active layer, and a second conductive semiconductor layer, a plurality of conductive vias passing through the second conductive semiconductor layer and the active layer to be connected to the first conductive semiconductor layer, and a conductive line extending along an edge of the light emitting stack, and passing through the second conductive semiconductor layer and the active layer, in which the plurality of conductive vias and the conductive line are formed of metallic materials reflecting light emitted from the active layer in a horizontal direction.

According to an embodiment, a semiconductor light emitting device may include a light emitting stack including a first conductive semiconductor layer, an active layer, and a second conductive semiconductor layer, a plurality of conductive vias passing through the second conductive semiconductor layer and the active layer to be connected to the first conductive semiconductor layer, and a reflective structure disposed adjacent to an edge of the light emitting stack.

BRIEF DESCRIPTION OF THE DRAWINGS

Features will become apparent to those of skill in the art by describing in detail exemplary embodiments with reference to the attached drawings in, which.

DETAILED DESCRIPTION

Detailed example embodiments will be hereinafter described in detail with reference to the attached drawings.

Figure 1:
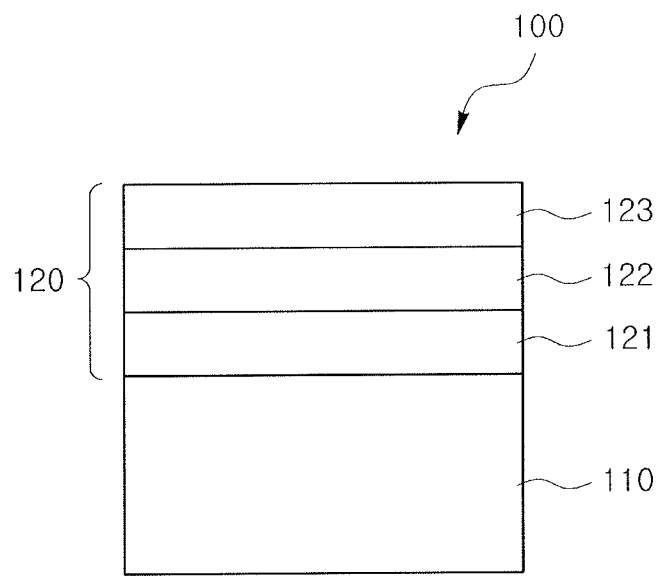
FIG. 1 illustrates a schematic cross-sectional view of a structure of a semiconductor buffer structure, according to an example embodiment.

FIG. 1 is a cross-sectional view schematically illustrating a structure of a semiconductor buffer structure 100, according to an example embodiment.

Referring to FIG. 1, the semiconductor buffer structure 100 may include a substrate 110 and a buffer layer 120 formed on the substrate 110. For example, a silicon or SiC substrate may be used as the substrate 110, e.g., the substrate 110 may have a Si(111) crystal plane.

The buffer layer 120 may be a layer provided as a stress compensation layer for growing a nitride semiconductor layer with satisfactory quality, e.g., with reduced cracks and defects, and may have a plurality of layers alternately disposed therein to receive tensile stress and compressive stress when grown. That is, when the buffer layer 120 is formed on the substrate 110 (e.g., a silicon substrate), a nitride semiconductor layer may be grown on the buffer layer 120, e.g., rather than directly on the substrate 110, thereby minimizing cracks in the resultant nitride semiconductor layer, e.g., as the buffer layer 120 minimizes tensile stress caused by lattice mismatch between the substrate 110 and the nitride semiconductor layer.

For this purpose, the buffer layer 120 may include a plurality of layers having a composition of $Al_xIn_yGa_{1-x-y}N$ ($0 \le x \le 1$, $0 \le y \le 1$, $0 \le x+y \le 1$), and a composition ratio may be determined to implement a lattice constant for obtaining stress required in each layer. The term "lattice constant" may hereinafter refer to a constant value or a lattice constant distribution, and further, when the term "lattice constant" is used for a constituent element including a plurality of layers, or a constituent element having a lattice constant distribution rather than a constant value, the term "lattice constant" may refer to a lattice constant average of the constituent element.

In the example embodiment, the buffer layer 120 may include a first layer 121, a second layer 122, and a third layer 123. The first layer 121 may have a composition of $Al_xIn_yGa_{1-x-y}N$ (0≤x≤1, 0≤y≤1, 0≤x+y≤1), a lattice constant LP1 of the first layer 121 may be smaller than a lattice constant LP0 of the substrate 110, and the first layer 121 may receive tensile stress from the substrate 110 disposed therebelow when grown. The second layer 122 may be formed on the first layer 121, may have a composition of $Al_xIn_yGa_{1-x-y}N$ (0≤x<1, 0≤y<1, 0≤x+y<1), a lattice constant LP2 of the second layer 122 may be greater than the lattice constant LP1 and smaller than LPc, and the second layer 122 may receive compressive stress from the first layer 121 disposed therebelow when grown. Here, LPc refers to a lattice constant having a composition of $Al_xIn_yGa_{1-x-y}N$ (0≤x≤1, 0≤y<1, 0≤x+y<1) that corresponds to a light emitting wavelength λa of an active layer. The third layer 123 may be formed on the second layer 122, may have a composition of $Al_xIn_yGa_{1-x-y}N$ (0≤x<1, 0≤y<1, 0≤x+y<1), a lattice constant LP3 of the third layer 123 may be lower than the lattice constant LP2, and the third layer 123 may receive tensile stress from the second layer 122 disposed therebelow when grown.

For example, the first layer 121 may be a layer directly contacting the silicon substrate 110, and may be formed of AlN. In another example, the first layer 121 may be formed of a nitride of a metal other than the Group III metal, e.g., the first layer 121 may be formed of at least one of $HfN_x$, $ZrN_x$, $TaN_x$, TiN, and $WN_x$.

In the above manner, the buffer layer 120 may include three or more layers including at least one a constituent layer receiving tensile stress and at least one constituent layer receiving compressive stress, and the layers may be alternately formed. The layer receiving tensile stress may be disposed in a position of an odd-numbered layer on the substrate 110, e.g., a first layer directly on the substrate 110, and may be adjusted to have a proper thickness and composition, so as to prevent cracking from occurring therein due to an excessive tensile stress when grown. The layer receiving compressive stress may be disposed in a position of an even-numbered layer on the substrate 110, e.g., a second layer on the substrate 110, and may have a sufficient thickness such that the sum of stresses of the layers forming the buffer layer 120 may be compressive stress. Thus, an occurrence of cracks within a nitride semiconductor layer grown subsequently on the buffer layer 120 may be reduced.

FIGS. 2A through 2D are views illustrating detailed examples of individual layers employed in the buffer layer 120 of the semiconductor buffer structure 100 of FIG. 1.

Figure 2A:
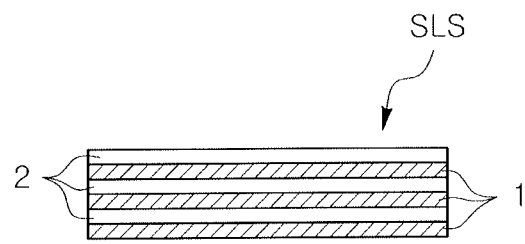
FIGS. 2A through 2D illustrate schematic views of detailed examples of individual layers within a buffer layer of the semiconductor buffer structure of FIG. 1.
Figure 2B:
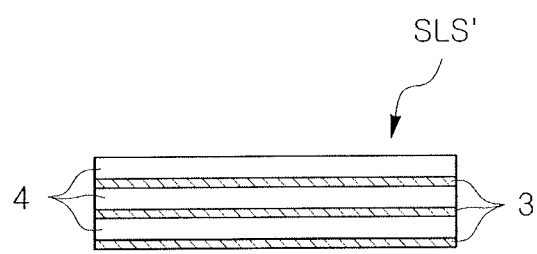

FIGS. 2A and 2B are structures that may be used in at least one of the layers forming the buffer layer 120, and depict examples of superlattice structure layers SLS and SLS'.

The superlattice structure layer SLS of FIG. 2A may be a structure for implementing a corresponding lattice constant, for example, a lattice constant condition for at least one of the layers forming the buffer layer 120, and two layers 1 and 2, having different lattice constants, may be alternately stacked in the structure. Thicknesses of the two layers 1 and 2, having the different lattice constants, may be the same. The two layers 1 and 2 may include a composition of $Al_xIn_yGa_{1-x-y}N$ (0≤x≤1, 0≤y≤1, 0≤x+y≤1), and x and y compositions of each layer may be determined according to lattice constants to be implemented.

The superlattice structure layer SLS' of FIG. 2B may be a structure for implementing a corresponding lattice constant, for example, a lattice constant condition for at least one of the layers forming the buffer layer 120, two layers 3 and 4, having different lattice constants, may be alternately stacked in the structure, and thicknesses of the two layers 3 and 4, having the different lattice constants, may be different. The two layers 3 and 4 may include a composition of $Al_xIn_yGa_{1-x-y}N$ (0≤x≤1, 0≤y≤1, 0≤x+y≤1), and x and y compositions of each layer may be determined according to lattice constants to be implemented.

Figure 2C:
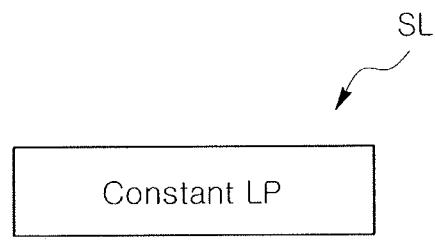
Figure 2D:
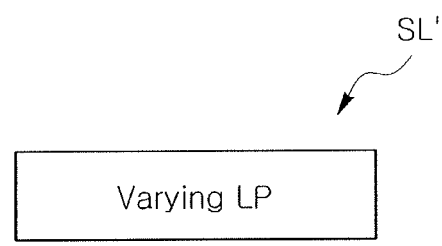

FIGS. 2C and 2D are examples of implementing, as a single layer, a corresponding lattice constant, for example, a lattice constant condition for at least one of the layers forming the buffer layer 120. Here, the single layer may mean that the single layer includes one layer having no physical boundary therein, and may not mean that a composition of matter is constant within the single layer. A single layer SL of FIG. 2C may have a lattice constant LP that is constant in a thickness direction thereof, and a single layer SL' of FIG. 2C may have a lattice constant LP that varies in a thickness direction thereof.

Figure 3:
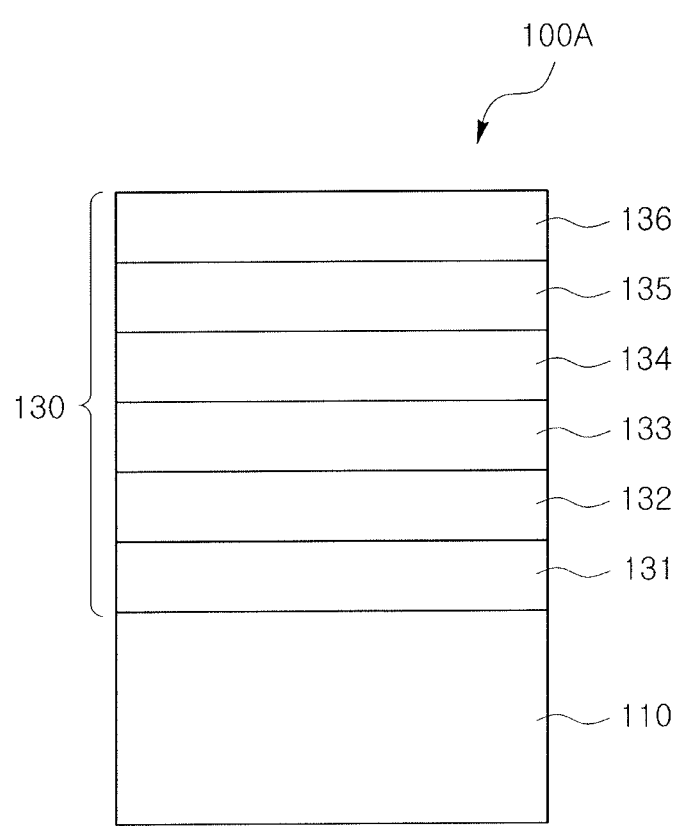
FIG. 3 illustrates a schematic cross-sectional view of a structure of a semiconductor buffer structure, according to an example embodiment.

FIG. 3 is a cross-sectional view schematically illustrating a structure of a semiconductor buffer structure, according to an example embodiment.

As illustrated in FIG. 3, in the example embodiment, the semiconductor buffer structure 100A may include a buffer layer 130 on the substrate 110. The buffer layer 130 may include a first layer 131, a second layer 132, a third layer 133, a fourth layer 134, a fifth layer 135, and a sixth layer 136. The buffer layer 130 may include the first layer 131, the third layer 133, and the fifth layer 135, which may receive tensile stress when grown, and the second layer 132, the fourth layer 134, and the sixth layer 136, which may receive compressive stress when grown.

The first layer 131 may have a composition of $Al_xIn_yGa_{1-x-y}N$ (0≤x≤1, 0≤y≤1, 0≤x+y≤1), a lattice constant LP1 of the first layer 131 may be smaller than a lattice constant LP0 of a substrate 110, and the first layer 131 may receive tensile stress from the substrate 110 disposed therebelow when grown. The second layer 132 may be formed on the first layer 131, may have a composition of $Al_xIn_yGa_{1-x-y}N$ (0≤x<1, 0≤y<1, 0≤x+y<1), a lattice constant LP2 of the second layer 132 may be greater than the lattice constant LP1, and the second layer 132 may receive compressive stress from the first layer 131 disposed therebelow when grown.

The third layer 133 may have a composition of $Al_xIn_yGa_{1-x-y}N$ (0≤x≤1, 0≤y≤1, 0≤x+y≤1), a lattice constant LP3 of the third layer 133 may be smaller than the lattice constant LP2 of the second layer 132, and the third layer 133 may receive tensile stress from the second layer 132 disposed therebelow when grown. The fourth layer 134 may be formed on the third layer 133, may have a composition of $Al_xIn_yGa_{1-x-y}N$ (0≤x<1, 0≤y<1, 0≤x+y<1), a lattice constant LP4 of the fourth layer 134 may be greater than the lattice constant LP3, and the fourth layer 134 may receive compressive stress from the third layer 133 disposed therebelow when grown.

The fifth layer 135 may have a composition of $Al_xIn_yGa_{1-x-y}N$ (0≤x≤1, 0≤y≤1, 0≤x+y≤1), a lattice constant LP5 of the fifth layer 135 may be smaller than the lattice constant LP4 of the fourth layer 134, and the fifth layer 135 may receive tensile stress from the fourth layer 134 disposed therebelow when grown. The sixth layer 136 may be formed on the fifth layer 135, may have a composition of $Al_xIn_yGa_{1-x-y}N$ ($0 \le x \le 1$, $0 \le y \le 1$, $0 \le x+y \le 1$), a lattice constant LP6 of the sixth layer 136 may be greater than the lattice constant LP5 and smaller than LPc, and the sixth layer 136 may receive compressive stress from the fifth layer 135 disposed therebelow when grown. Here, LPc refers to a lattice constant having a composition of $Al_xIn_yGa_{1-x-y}N$ ($0 \le x < 1$, $0 \le y < 1$, $0 \le x+y < 1$) that corresponds to a light emitting wavelength λa of an active layer.

For example, the first layer 131 may be a layer directly contacting the substrate 110, and may be formed of AlN. In another example, the first layer 131 may be formed of a nitride of a metal other than the Group III metal, e.g., the first layer 131 may be formed of at least one of $HfN_x$, $ZrN_x$, $TaN_x$, TiN, and $WN_x$.

For example, the buffer layer 130 may include 6 constituent layers, but example embodiments are not limited thereto. The buffer layer 130 may also include three or more constituent layers. The buffer layer 130 may be designed such that the sum of stresses of all the constituent layers may be a compressive stress. Thus, an occurrence of cracks within a nitride semiconductor layer grown on the buffer layer 130 may be reduced.

Figure 4:
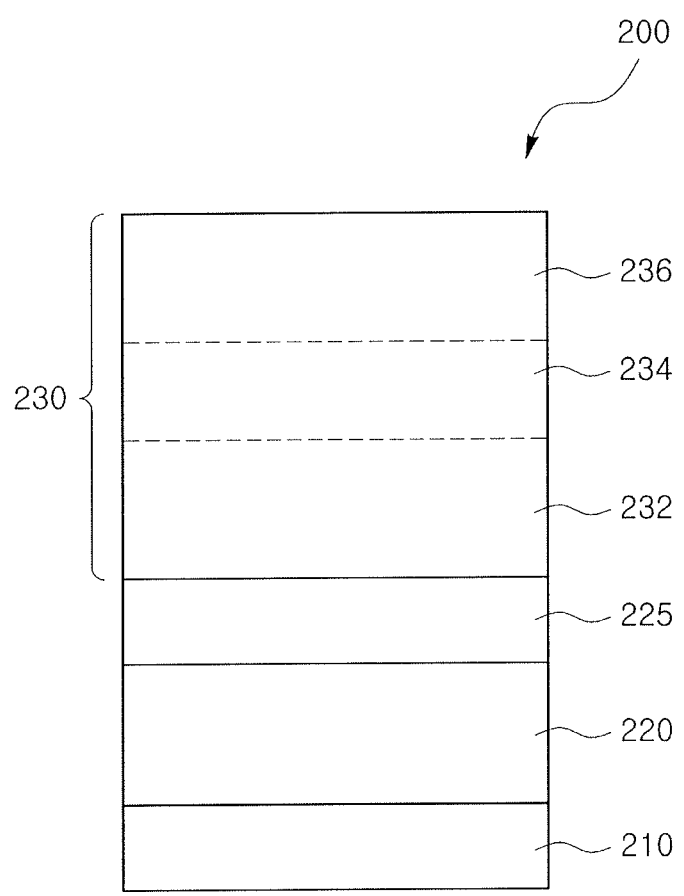
FIG. 4 illustrates a schematic cross-sectional view of a structure of a semiconductor device, according to an example embodiment.

FIG. 4 is a cross-sectional view schematically illustrating structure of a semiconductor device, according to an example embodiment.

Referring to FIG. 4, a semiconductor device 200, according to an example embodiment, may include a substrate 210, a buffer layer 220 formed on the substrate 210, a nitride semiconductor layer 225 formed on the buffer layer 220, and a light emitting stack 230 formed on the nitride semiconductor layer 225. For example, as illustrated in FIG. 4, the substrate 210, the buffer layer 220, the nitride semiconductor layer 225, and the light emitting stack 230 may be stacked directly on top of each other in the stated order. For example, the buffer layer 220 may be the same as either of the buffer layers 120 and 130 described previously with reference to FIGS. 1-3.

As further illustrated in FIG. 4, the light emitting stack 230 may include a first conductive semiconductor layer 232, an active layer 234, and a second conductive semiconductor layer 236. For example, the first conductive semiconductor layer 232 may be directly on the nitride semiconductor layer 225, and the active layer 234 may be between the first and second conductive semiconductor layers 232 and 236.

The first conductive semiconductor layer 232 may be a semiconductor layer doped with first conductivity type impurities, and may be formed of a Group III-V nitride semiconductor material, e.g., a semiconductor material having a composition of $Al_xGa_yIn_zN$ ($0 \le x \le 1$, $0 \le y \le 1$, $0 \le z \le 1$, $x+y+z=1$) doped with n-type impurities. The n-type impurities may be, e.g., Si, Ge, Se, or Te.

The second conductive semiconductor layer 236 may be a semiconductor layer doped with second conductivity type impurities, and may be formed of a Group III-V nitride semiconductor material. e.g., a semiconductor material having a composition of $Al_xGa_yIn_zN$ ($0 \le x \le 1$, $0 \le y \le 1$, $0 \le z \le 1$, $x+y+z=1$) doped with p-type impurities. The p-type impurities may be, e.g., Mg, Zn, or Be.

The active layer 234 may be a layer emitting light by the combination of electrons and holes, and a level of energy, corresponding to a band gap of the active layer 234, may be emitted in the form of light. The active layer 234 may have a single quantum well or a multiple quantum well structure formed by adjusting the band gap by periodically changing x, y, and z values of $Al_xGa_yIn_zN$. For example, a quantum well structure may include at least one quantum well layer and at least one quantum barrier layer of AlGaN/AlGaN, AlGaN/AlN, InGaN/GaN, InGaN/InGaN, InGaN/AlGaN, or InGaN/InAlGaN. Each of the first conductive semiconductor layer 232 and the second conductive semiconductor layer 236 may include a single layer structure, but may also include a multilayer structure. For example, when emitting UV-C light, i.e., a wavelength range of about 200 nm to 280 nm, the quantum well layers and the barrier layers may be formed of a composition of $Al_xGa_{1-x}N$ ($0.42 \le x \le 1$) having a high aluminum (Al) composition, e.g., Al composition of about 42% or higher.

Figure 5:
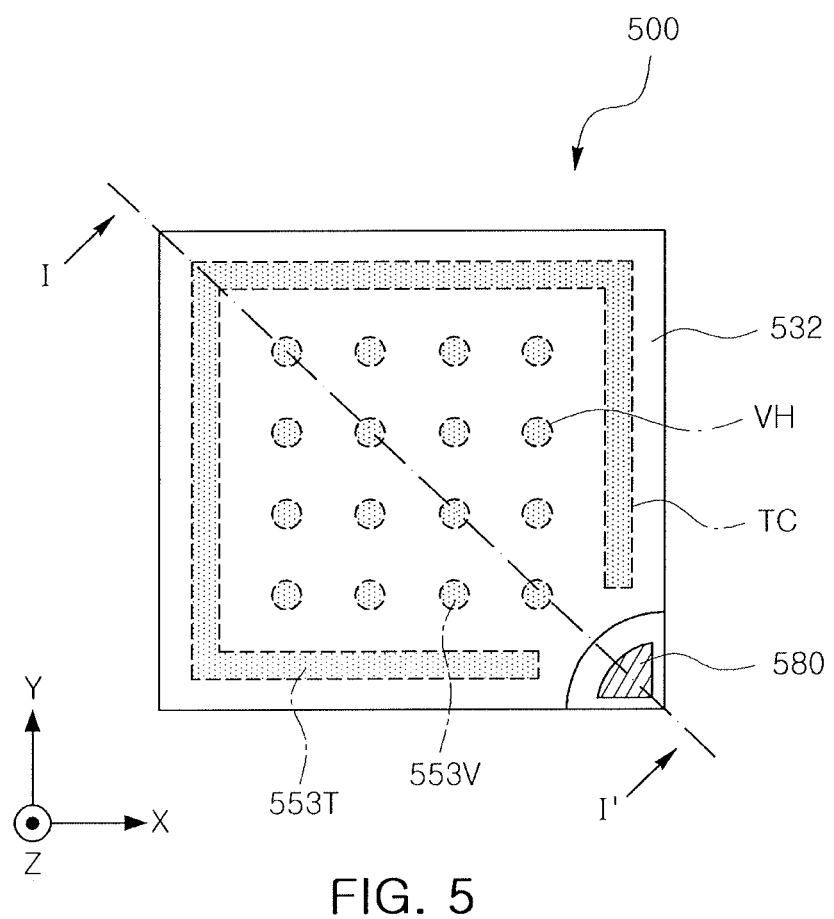
FIGS. 5 and 6 illustrate a plan view and a cross-sectional view, respectively, of a semiconductor light emitting device, according to an example embodiment.
Figure 6:
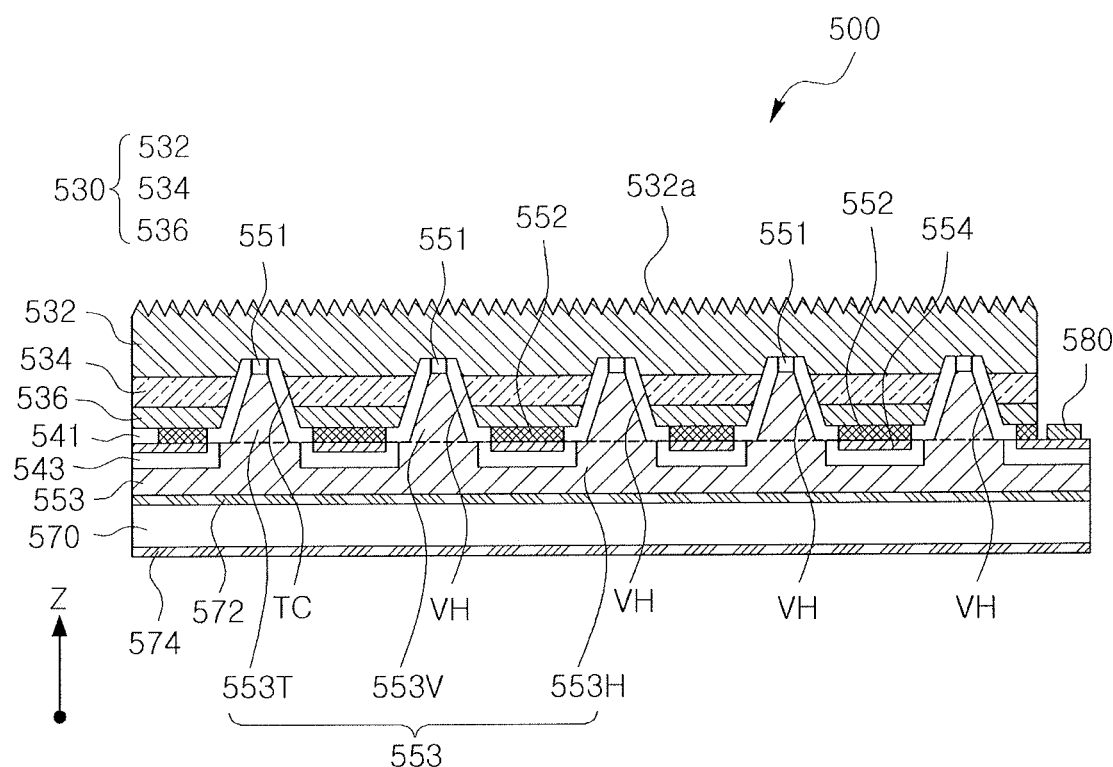

FIGS. 5 and 6 are a plan view and a cross-sectional view, respectively, illustrating a semiconductor light emitting device 500 according to an example embodiment. In particular, FIG. 6 is a cross-sectional view along line I-I' of FIG. 5. For example, as will be described in more detail below with reference to FIGS. 14A-14E, such semiconductors light emitting devices may be formed on the buffer structures described previously with reference to FIGS. 1-3.

Referring to FIGS. 5 and 6, the semiconductor light emitting device 500 may include a conductive support substrate 570, a reflective metal layer 553, a light emitting stack 530, a first electrode 551, a second electrode 552, and a connecting metal layer 554. The light emitting stack 530 may include a second conductive semiconductor layer 536, an active layer 534, and a first conductive semiconductor layer 532 sequentially stacked on the conductive support substrate 570.

The conductive support substrate 570 may be, e.g., a Si or a SiAl substrate. A bonding metal layer 572 may be disposed on a first surface of the conductive support substrate 570, i.e., between the conductive support substrate 570 and the reflective metal layer 553. Selectively, a rear metal layer 574 may be disposed on a second surface of the conductive support substrate 570, i.e., on a surface of the conductive support substrate 570 facing away from the reflective metal layer 553.

To form the first electrode 551 contacting the first conductive semiconductor layer 232, a plurality of via holes VH and a trench TC may be formed through the second conductive semiconductor layer 536 and the active layer 534. The via holes VH may be arranged to have various shapes in rows and columns, as illustrated in FIG. 5, in order to reduce a level of contact resistance to the first electrode 551 and improve current flow. The trench TC may extend along edges of the light emitting stack 530, e.g., the trench TC may extend along four lateral surfaces of the light emitting stack 530 (along x and y direction in a plan view of FIG. 5) while extending through the second conductive semiconductor layer 536 and the active layer 534 (in the z direction in FIG. 6), and may be integrally, e.g., continuously, formed along all edges of the light emitting stack 530 (FIG. 5). The via holes VH and the trench TC may be formed in the light emitting stack 530 before formation of the reflective metal layer 553 thereon and before an attachment between the light emitting stack 530 and the conductive support substrate 570, as will be described in more detail below with reference to FIGS. 14A-14D.

A first passivation layer 541, i.e., an insulating layer, may cover lateral surfaces of the via holes VH and a portion of a surface of the second conductive semiconductor layer 536 facing away from the active layer 534. The first electrode 551 may pass through the first passivation layer 541 formed within the via holes VH and the trench TC to be in contact with the first conductive semiconductor layer 532. For example, as illustrated in FIG. 6, two opposite surfaces of the first electrode 551 may be in, e.g., direct, contact with portions of the first passivation layer 541, while a surface of the first electrode 551 between the two opposite surfaces may be in direct contact with the first conductive semiconductor layer 532, e.g., the first electrode 551 may be centered along a vertical axis of each of the via holes VH.

The second electrode 552 may pass through the first passivation layer 541 to be in contact with the second conductive semiconductor layer 536. For example, as illustrated in FIG. 6, upper and lower surfaces of the second electrode 552 may be level with respective upper and lower surfaces of the first passivation layer 541 on a surface of the second conductive semiconductor layer 536 facing the conductive support substrate 570. The connecting metal layer 554 may, e.g., completely, cover the second electrode 552, e.g., the second electrode 552 may be between the connecting metal layer 554 and the second conductive semiconductor layer 536. A second passivation layer 543, i.e., an insulating layer, may cover, e.g., all exposed surfaces of, the connecting metal layer 554, e.g., so the connecting metal layer 554 may be between the second electrode 552 and the second passivation layer 543.

The reflective metal layer 553 may connect to the first electrode 551, and may, e.g., completely, fill the via holes VH and the trench TC. That is, the reflective metal layer 553 may include conductive vias 553V filling the via holes VH, a conductive line 553T filling the trench TC, and a horizontal conductive layer 553H covering the conductive vias 553V and the conductive line 553T (a dashed line in FIG. 6 is illustrated between the horizontal conductive layer 553H and each of the conductive vias 553V and the conductive line 553T. The conductive vias 553V may be arranged to have various shapes in rows and columns, e.g., corresponding to shapes of the via holes VH. The conductive line 553T may extend along the edge of the light emitting stack 530, e.g., continuously within the entire trench TC. The conductive line 553T may extend along the four lateral surfaces of the light emitting stack 530, and may be integrally formed. The reflective metal layer 553 may be formed of a reflective metal reflecting light emitted from the active layer 534. For example, the reflective metal layer 553 may include Ti, Ni, Au, or combinations thereof. The conductive line 553T may serve, together with the conductive vias 553V, as an electrode transmitting an electrical signal to the first conductive semiconductor layer 532, while serving as a reflective structure reflecting light emitted from the active layer 534, i.e., light emitted in the horizontal direction. Thus, light extraction efficiency of the semiconductor light emitting device 500 may be increased.

In detail, when the active layer 534 emits ultraviolet light, i.e., light having a wavelength range of about 200 to 400 nm, the amount of light components emitted in the horizontal direction may be great. Thus, the conductive line 553T, which reflects light emitted horizontally from the active layer 534, contribute considerably to improving light extraction efficiency of the semiconductor light emitting device 500.

The semiconductor light emitting device 500 may have a structure in which a Si substrate used as a substrate for growth, as well as a buffer layer thereon, may be removed, and the conductive support substrate 570 may be bonded to a side of the second conductive semiconductor layer 536. An upper surface of the first conductive semiconductor layer 532, i.e., a surface facing away from the conductive support substrate 570, may be texturized to increase light extraction efficiency, thereby forming an uneven pattern 532a. Further, while in the drawings, all of the Si substrate and the buffer layer are removed, a portion of the buffer layer may remain on the first conductive semiconductor layer 532 and may also be texturized together with the first conductive semiconductor layer 532.

The connecting metal layer 554, covering the second electrode 552, may extend externally of the light emitting stack 530, as illustrated in FIG. 6. An electrode pad 580 may be formed on a region of the connecting metal layer 554 that extends externally of the light emitting stack 530 (right side of the structure in FIG. 6).

Figure 7:
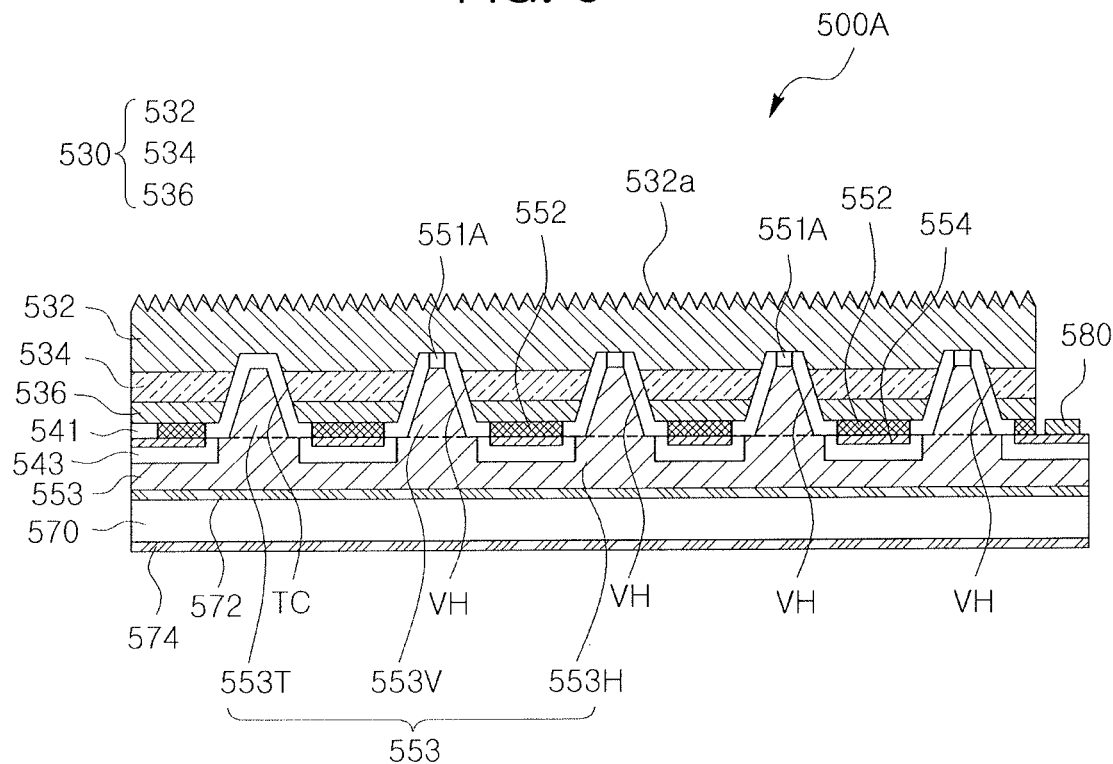
FIGS. 7 through 9 illustrate cross-sectional views of semiconductor light emitting devices, according to example embodiments.
Figure 8:
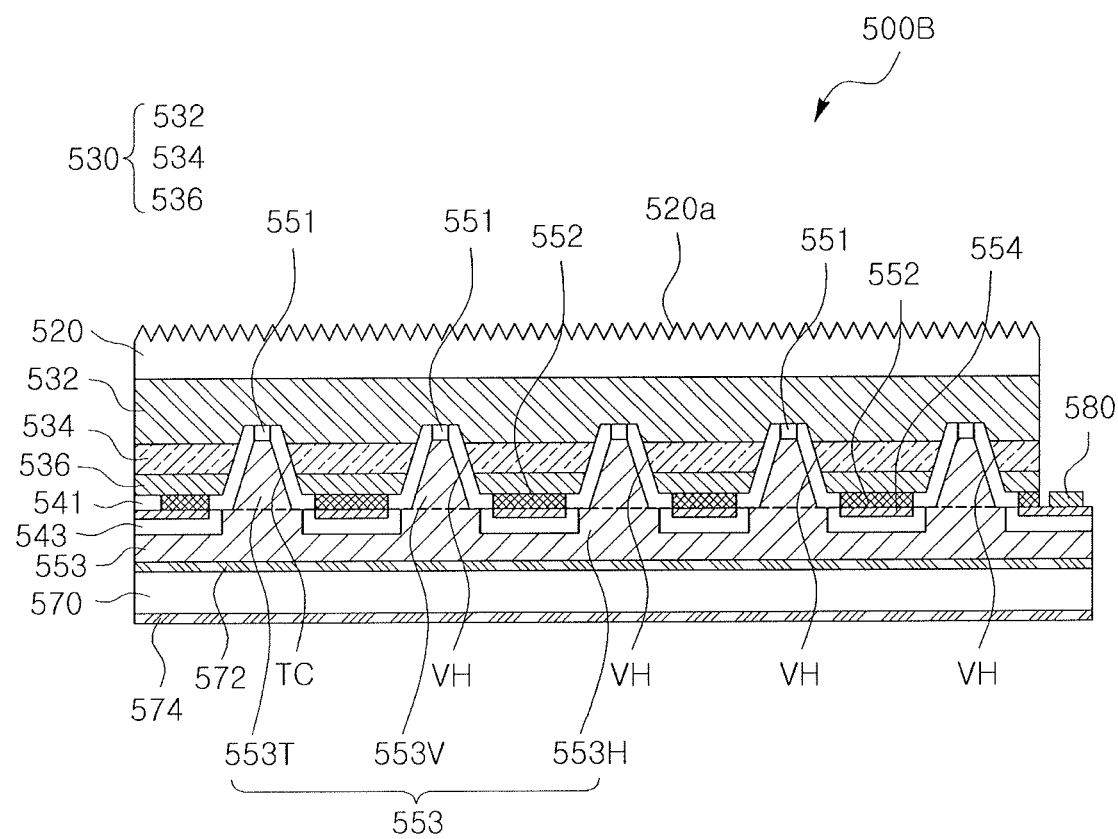
Figure 9:
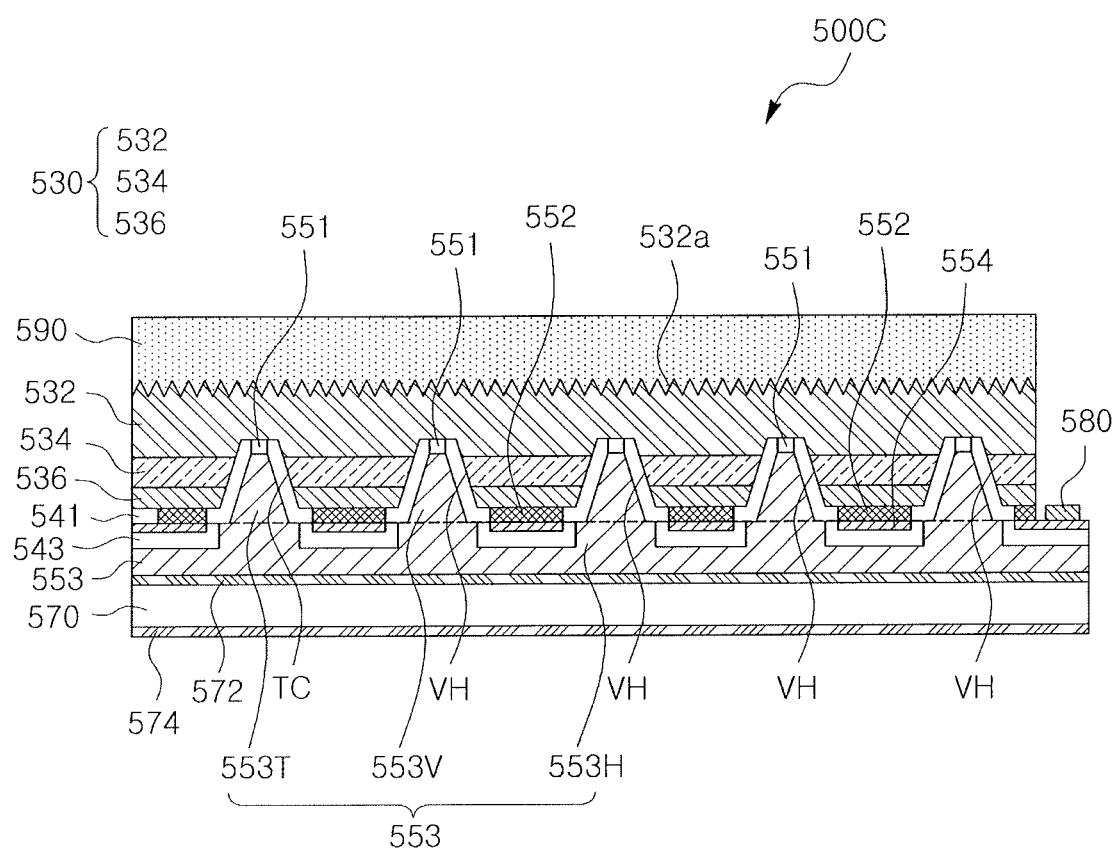

FIGS. 7 through 9 are cross-sectional views illustrating semiconductor light emitting devices, according to example embodiments. The semiconductor light emitting devices illustrated in FIGS. 7 through 9 have structures similar to that of the semiconductor light emitting device 500 of FIG. 6. Thus, a description of the same elements will be omitted, and only differences with respect to the semiconductor light emitting device 500 of FIG. 6 will be described hereinafter.

Referring to FIG. 7, a semiconductor light emitting device 500A may have the reflective metal layer 553 which includes the conductive vias 553V, the horizontal conductive layer 553H, and the conductive line 553T. However, the conductive line 553T fills the trench TC without being connected to the first conductive semiconductor layer 532. That is, a first electrode 551A may pass through the first passivation layer 541 in the via holes VH, but may not be formed within the trench TC. Thus, the conductive line 553T may be electrically insulated from the first conductive semiconductor layer 532 by the first passivation layer 541. The conductive line 553T may not serve as an electrode, but may serve as a reflective structure reflecting, in an upward direction of the semiconductor light emitting device 500A, light emitted from an active layer 534, in particular, light emitted in the horizontal direction.

Referring to FIG. 8, a semiconductor light emitting device 500B may further include a buffer layer 520 disposed on the first conductive semiconductor layer 532. An upper surface of the buffer layer 520 may include an uneven pattern 520a. The buffer layer 520 may be the buffer layer 120 or 130 described above with reference to FIGS. 1 through 3.

Referring to FIG. 9, a semiconductor light emitting device 500C may further include a wavelength conversion layer 590 disposed on the first conductive semiconductor layer 532. The wavelength conversion layer 590 may be a resin layer including a phosphor and/or quantum dots. The wavelength conversion layer 590 may serve to convert a wavelength of light emitted from the active layer 534, and may have a wavelength conversion material, e.g., a phosphor or quantum dots. The wavelength conversion layer 590 may include a red phosphor, a yellow phosphor, a green phosphor, a blue phosphor, or combinations thereof, if desired.

For example, the wavelength conversion layer 590 may, e.g., only, be formed on an upper surface of the first conductive semiconductor layer 532. In another example, the wavelength conversion layer 590 may cover, e.g., overlap, all of upper and lateral surfaces of the light emitting stack 530 including the first conductive semiconductor layer 532, the active layer 534, and a second conductive semiconductor layer 536.

FIGS. 10 through 13 are plan views illustrating semiconductor light emitting devices, according to example embodiments. The semiconductor light emitting devices illustrated in FIGS. 10 through 13 have structures similar to that of the semiconductor light emitting device 500 of FIG. 6. Thus, a description of the same elements will be omitted, and only differences with respect to the semiconductor light emitting device 500 of FIG. 6 will be described hereinafter.

Figure 10:
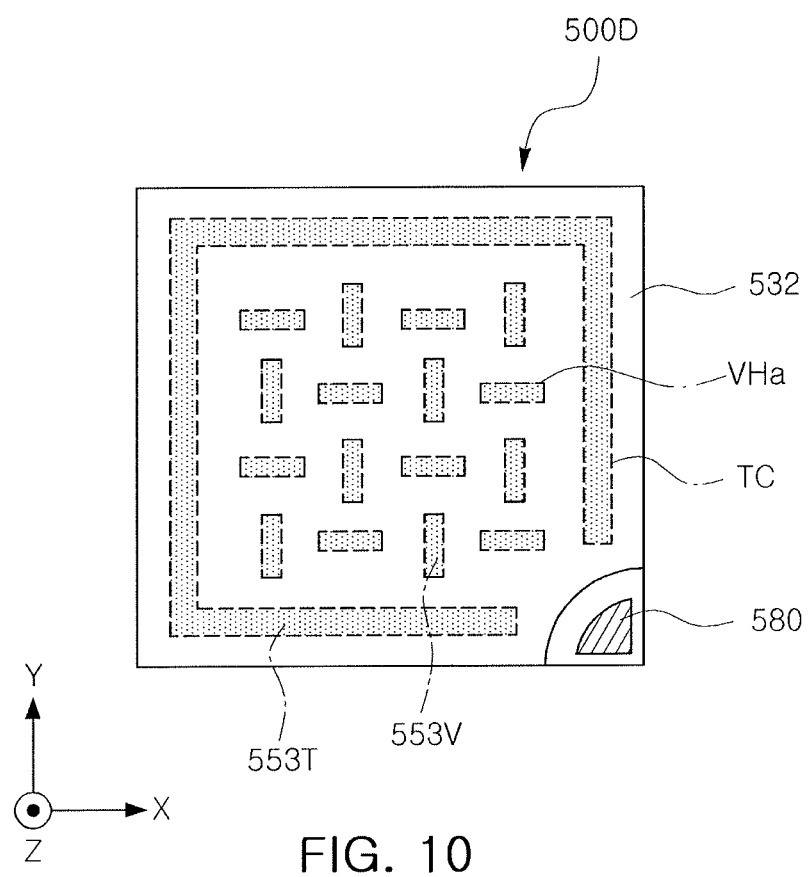
FIGS. 10 through 13 illustrate plan views of semiconductor light emitting devices, according to example embodiments.
Figure 11:
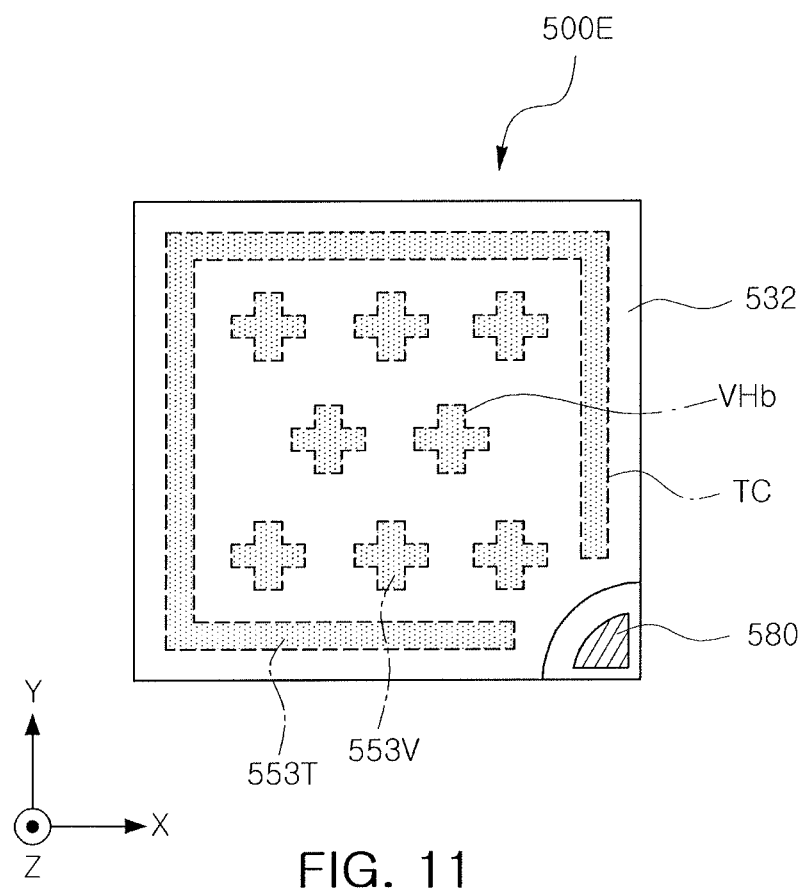

Referring to FIG. 10, a semiconductor light emitting device 500D may include a plurality of via holes VHa and a trench TC. A shape of the trench TC may be the same as described above. However, the via holes VHa may include first holes extending in a first direction in a plan view (e.g., along the x-axis in FIG. 10), and second holes extending in a second direction intersecting the first direction in a plan view (e.g., along the y-axis in FIG. 10). The first holes and the second holes may be arranged to have various shapes in rows and columns. A plurality of conductive vias 553V may include first conductive vias extending in the first direction, and second conductive vias extending in the second direction intersecting the first direction to fill the respective first and second holes of the via holes VHa.

For example, as illustrated in FIG. 10, the first holes and the second holes may be alternately disposed in the first direction or the second direction. The first conductive vias and the second conductive vias may be alternately disposed in the first direction or the second direction. The conductive vias 553V may efficiently reflect light emitted from an active layer 534, in particular, light emitted in the horizontal direction.

Referring to FIG. 1, a semiconductor light emitting device 500E may include a plurality of via holes VHb and the trench TC. The shape of the trench TC may be the same as described above, but the via holes VHb may have a cruciform shape in a plan view and may be disposed in a zigzag form, as viewed in a plan view. A plurality of conductive vias 553V may have a cruciform shape to fill the cruciform shape of the via holes VHb, and may be disposed in zigzag form. The conductive vias 553V may efficiently reflect light emitted from an active layer 534, in particular, light emitted in the horizontal direction.

Figure 12:
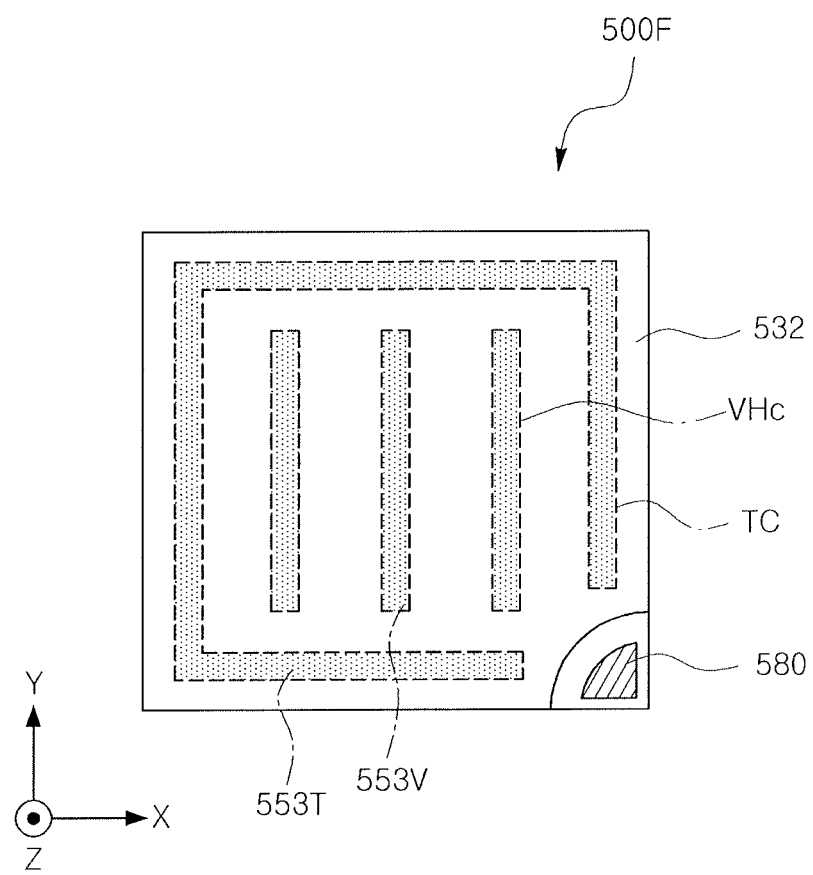

Referring to FIG. 12, a semiconductor light emitting device 500F may include a plurality of via holes VHc and the trench TC. The shape of the trench TC may be the same as described above, but the via holes VHc may have a line shape extending in one direction, e.g., the via holes VHc may have a stripe pattern having parallel lines extending in the y-axis. A plurality of conductive vias 553V may have a line shape extending in one direction. The conductive vias 553V may efficiently reflect light emitted from an active layer 534, in particular, light emitted in the horizontal direction.

Figure 13:
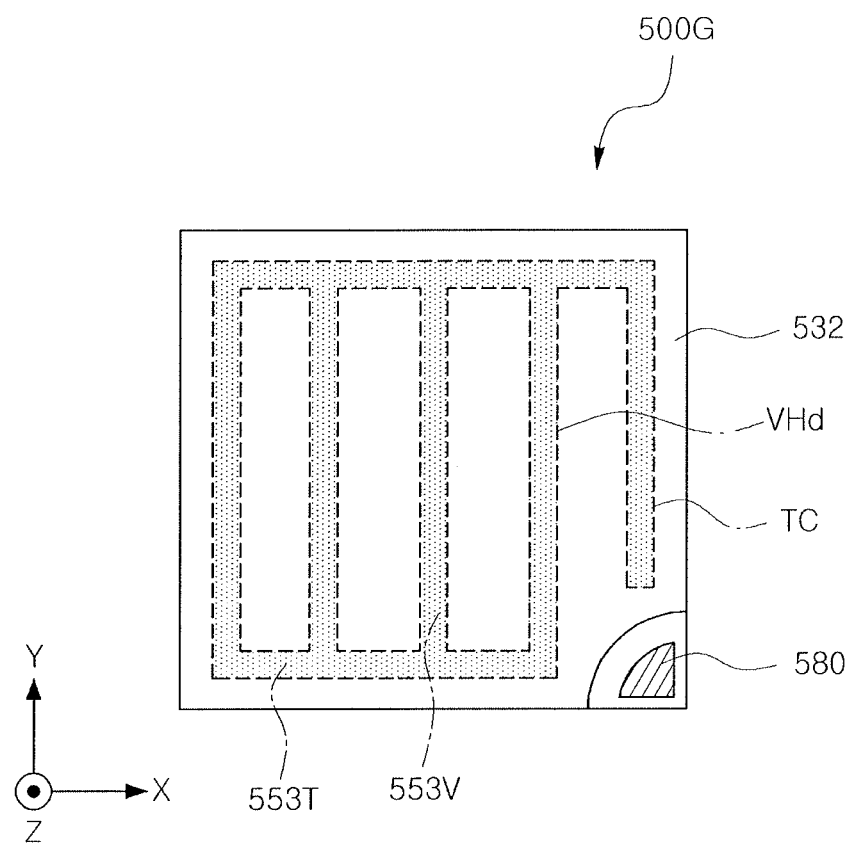

Referring to FIG. 13, a semiconductor light emitting device 500G may include a plurality of via holes VHd and the trench TC. The shape of the trench TC may be the same as described above, but the via holes VHd may have a line shape extending in one direction, and may extend in the one direction to be connected to the trench TC. A plurality of conductive vias 553V may extend in one direction to be connected to a conductive line 553T. The conductive vias 553V may efficiently reflect light emitted from an active layer 534, in particular, light emitted in the horizontal direction.

FIGS. 14A through 14E are cross-sectional views illustrating stages in a method of manufacturing a semiconductor light emitting device, according to an example embodiment.

Figure 14A:
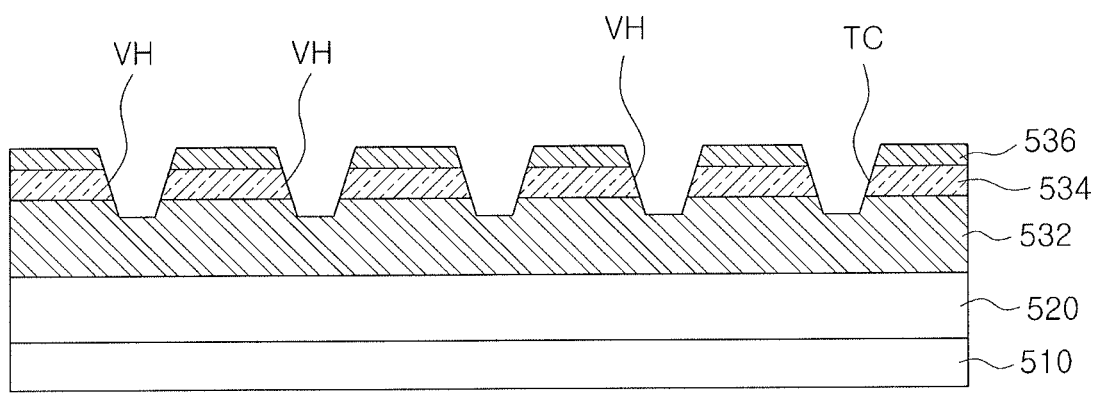
FIGS. 14A through 14E illustrate cross-sectional views of stages in a method of manufacturing a semiconductor light emitting device, according to an example embodiment.

Referring to FIG. 14A, a substrate 510, the buffer layer 520, the first conductive semiconductor layer 532, the active layer 534, and the second conductive semiconductor layer 536 may be sequentially formed first. A non-doped nitride semiconductor layer may further be formed between the buffer layer 520 and the first conductive semiconductor layer 532, e.g., the nitride semiconductor layer 225 discussed previously with reference to FIG. 4. For example, if the non-doped nitride semiconductor layer is not formed on the buffer layer 520, the first conductive semiconductor layer 532, which includes a nitride semiconductor layer, may be formed directly on the buffer layer 520, e.g., without cracks as discussed previously. Subsequently, the plurality of via holes VH and the trench TC may be formed through the first conductive semiconductor layer 532 and the active layer 534 to expose portions of the second conductive semiconductor layer 536.

The buffer layer 520, the first conductive semiconductor layer 532, the active layer 534, and the second conductive semiconductor layer 536 may be formed on the substrate 510 by any suitable semiconductor growth method, e.g., metal organic chemical vapor deposition (MOCVD), molecular beam epitaxy (MBE), or hydride vapor phase epitaxy (HVPE).

When the first conductive semiconductor layer 532 and the second conductive semiconductor layer 536 are formed, impurity gases may be supplied to dope the first conductive semiconductor layer 532 and the second conductive semiconductor layer 536 with n- or p-type impurities. The n-type impurities may be, e.g., Si, Ge, Se, or Te, and the p-type impurities may be, e.g., Zn, Cd, Be, Mg, Ca, or Ba. The via holes VH and the trench TC may be simultaneously formed by a single dry etching process.

Figure 14B:
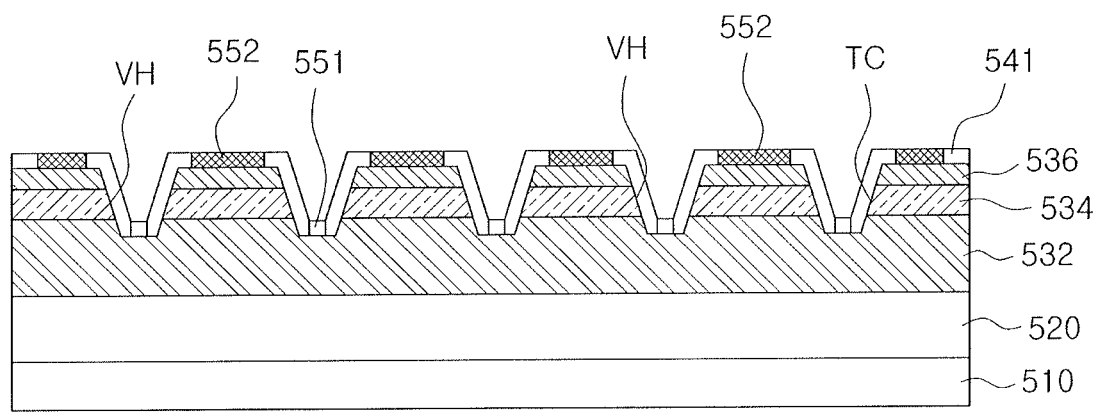

Referring to FIG. 14B, the first passivation layer 541 may be, e.g., conformally and continuously, formed along an upper surface of the second conductive semiconductor layer 536 and internal surfaces of the via holes VH. The first passivation layer 541 may be formed by depositing an insulating material, e.g., a silicon oxide ($SiO_2$) or an aluminum oxide ($Al_2O_3$).

Subsequently, a portion of the first passivation layer 541 disposed on the second conductive semiconductor layer 536 may be etched, and the second electrode 552 may be formed on the exposed portion of the second conductive semiconductor layer 536. The second electrode 552 may be formed by depositing or plating, e.g., silver (Ag).

Subsequently, a portion of the first passivation layer 541, disposed on the first conductive semiconductor layer 532 within the via holes VH and the trench TC, may be etched, and the first electrode 551 may be formed on the exposed portion of the first conductive semiconductor layer 532. The first electrode 551 may be formed by depositing or plating, e.g., chromium (Cr).

Figure 14C:
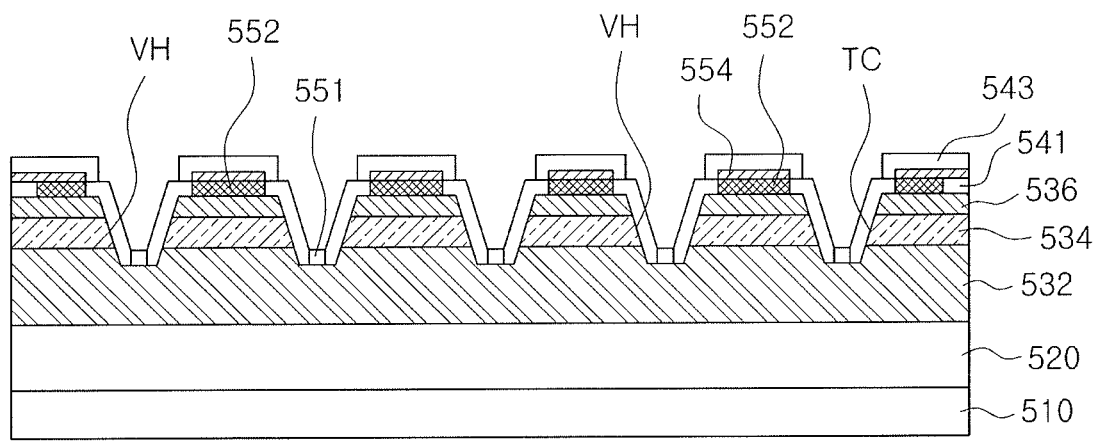

Referring to FIG. 14C, the connecting metal layer 554 may further be formed on the second electrode 552. The connecting metal layer 554 may be provided to subsequently connect an electrode pad to the second electrode 552. The connecting metal layer 554 may be formed by depositing or plating, e.g., gold (Au).

Subsequently, the second passivation layer 543 may be formed to cover the connecting metal layer 554. The second passivation layer 543 may be formed by depositing an insulating material, e.g., a silicon oxide ($SiO_2$) or an aluminum oxide ($Al_2O_3$).

Figure 14D:
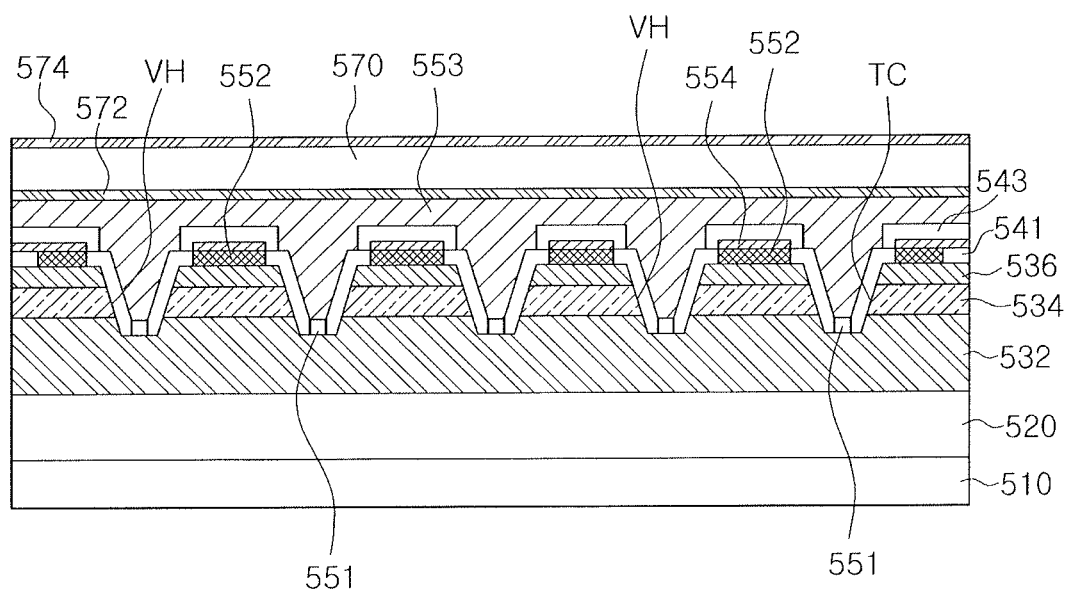

Referring to FIG. 14D, the reflective metal layer 553 may be formed to be connected to the first electrode 551, fill entireties of the via holes VH and the trench TC, and cover the second passivation layer 543. By the first passivation layer 541 and the second passivation layer 543, the reflective metal layer 553 may be electrically insulated from the second electrode 552, the active layer 534, and the second conductive semiconductor layer 536. The reflective metal layer 553 may be electrically insulated from the first electrode 551.

Subsequently, the conductive support substrate 570 may be attached to the reflective metal layer 553. The conductive support substrate 570 may be a Si or SiAl substrate. The bonding metal layer 572 may be disposed between the conductive support substrate 570 and the reflective metal layer 553. Selectively, the rear metal layer 574 may be disposed on the upper surface of the conductive support substrate 570.

Figure 14E:
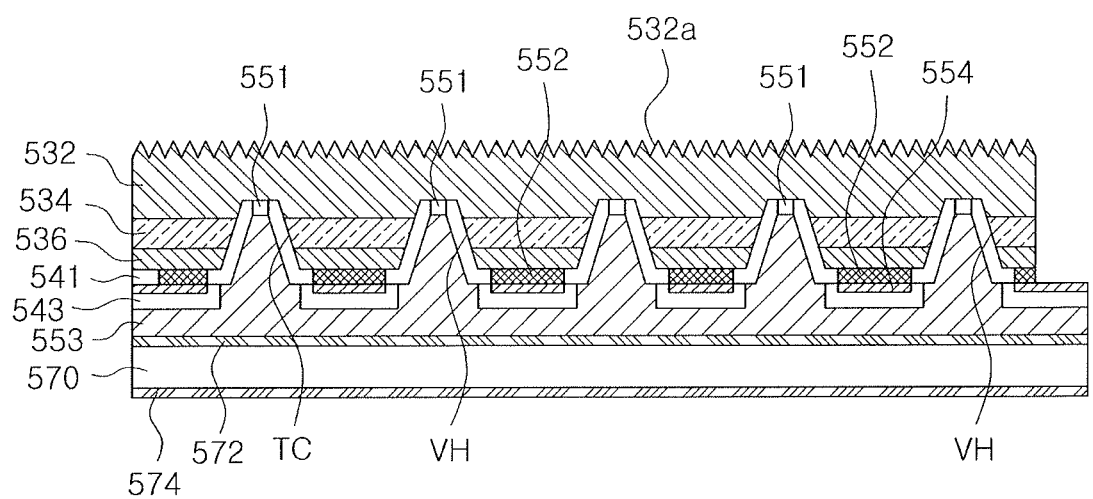

Referring to FIG. 14E, the Si substrate 510 and the buffer layer 520 may be removed. A method, e.g., etching or polishing, may be used to remove the Si substrate 510. For example, as illustrated in FIG. 14E, the buffer layer 520 may be entirely removed. In another example, portions of the buffer layer 520 may remain on the first conductive semiconductor layer 532 without being entirely removed.

Subsequently, an upper surface of the first conductive semiconductor layer 532 may be texturized to form the uneven pattern 532a on the upper surface. When a portion of the buffer layer 520 remains on the first conductive semiconductor layer 532, the portion may be texturized together with the upper surface of the first conductive semiconductor layer 532 to form the uneven pattern 532a. The texturing may be formed by dry or wet etching.

Subsequently, portions of the first conductive semiconductor layer 532, the active layer 534, and the second conductive semiconductor layer 536 may be etched to expose the connecting metal layer 554.

Referring again to FIG. 6, the electrode pad 580 may be formed on the exposed connecting metal layer 554. The electrode pad 580 may be connected to the second electrode 552 through the connecting metal layer 554.

Figure 15:
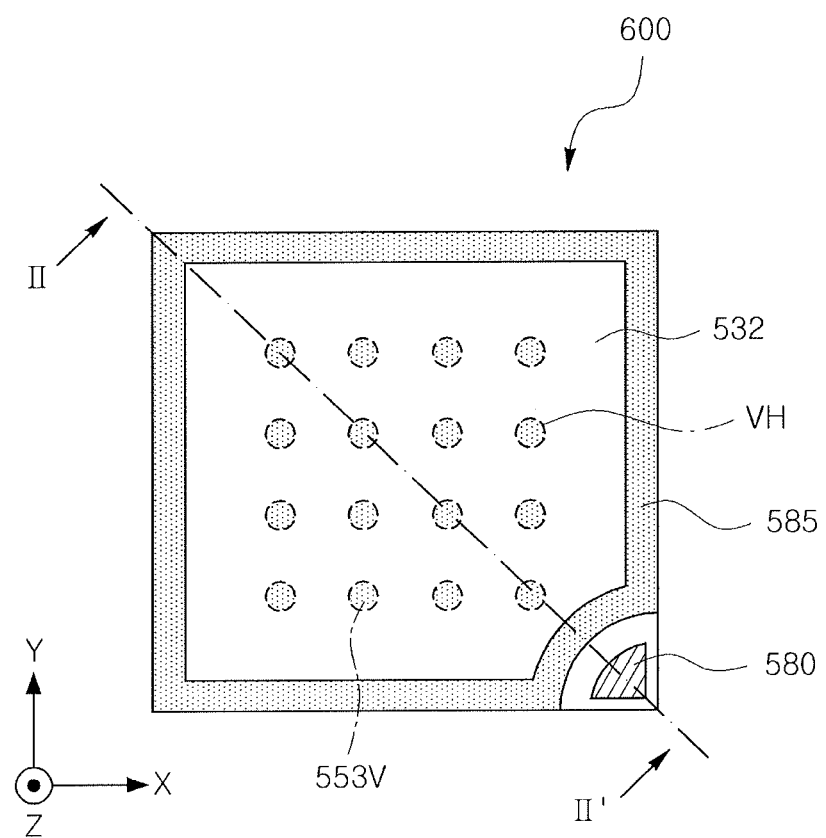
FIGS. 15 and 16 illustrate a plan view and a cross-sectional view, respectively, of a semiconductor light emitting device, according to an example embodiment.
Figure 16:
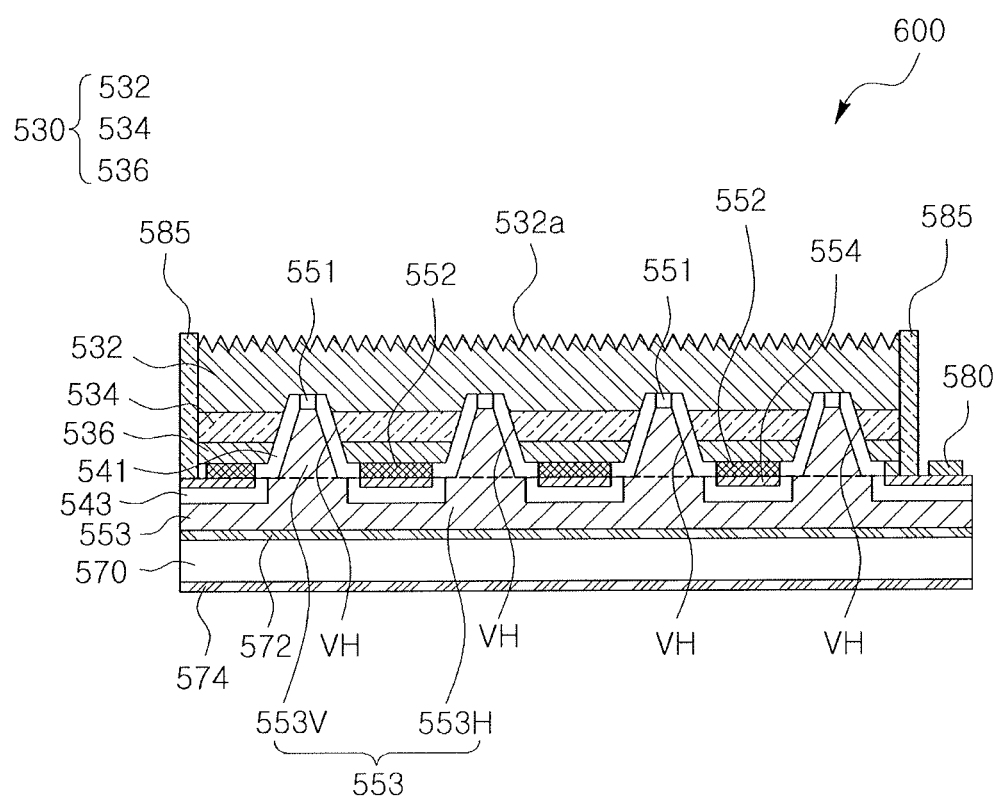

FIGS. 15 and 16 are a plan view and a cross-sectional view, respectively, illustrating a semiconductor light emitting device, according to an example embodiment.

Referring to FIGS. 15 and 16, a semiconductor light emitting device 600 may include the conductive support substrate 570, the reflective metal layer 553, the light emitting stack 530, the first electrode 551, the second electrode 552, and the connecting metal layer 554. The light emitting stack 530 may include the second conductive semiconductor layer 536, the active layer 534, and the first conductive semiconductor layer 532 sequentially stacked on the conductive support substrate 570.

To form the first electrode 551 contacting the first conductive semiconductor layer 532, the plurality of via holes VH may be formed through the second conductive semiconductor layer 536 and the active layer 534. However, the trench TC may not be formed in the semiconductor light emitting device 600, unlike in the above-mentioned semiconductor light emitting devices 500, 500A, 500B, 500C, 500D, 500E, 500F, and 500G.

Alternatively, as illustrated in FIGS. 15-16, the semiconductor light emitting device 600 may include a reflective layer 585 disposed on four lateral surfaces of the light emitting stack 530, and reflecting light emitted from the active layer 534. The reflective layer 585 may be a Distributed Bragg Reflector (DBR) layer properly designed according to wavelengths of light emitted from the active layer 534. The DBR layer may have a structure in which a first insulating layer having a first refractive index and a second insulating layer having a second refractive index may be alternately stacked. The first insulating layer and the second insulating layer may include $SiO_2$, SiN, $SiO_xN_y$, $TiO_2$, $Si_3N_4$, $Al_2O_3$, $ZrO_2$, or $HfO_2$. The reflective layer 585 may have a structure in which an insulating layer and a reflective metal layer may be stacked.

Figure 17:
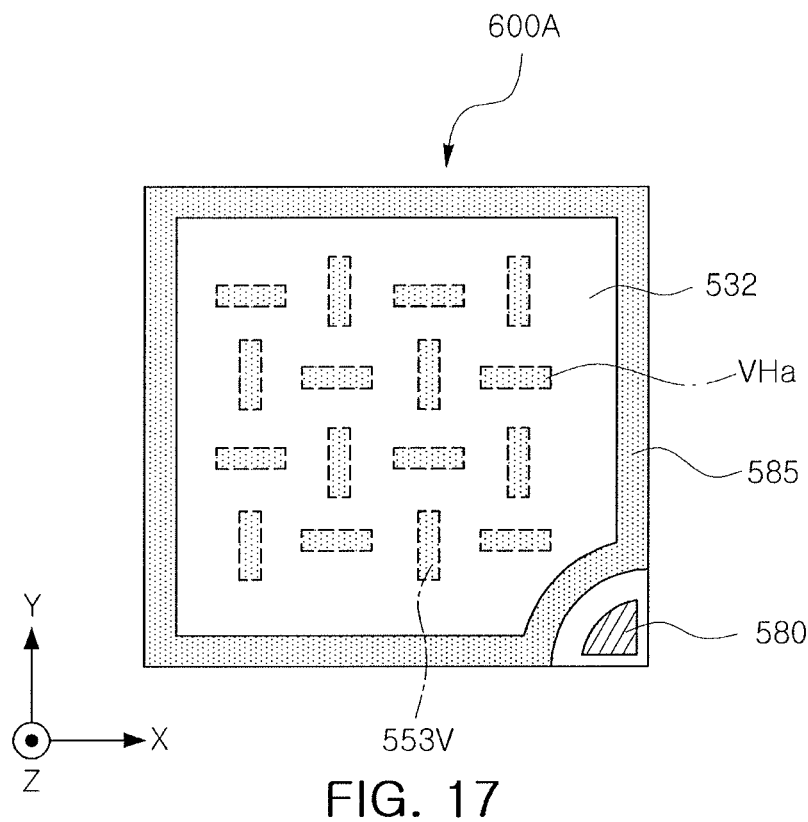
FIGS. 17 through 18 illustrate plan views of semiconductor light emitting devices, according to example embodiments.
Figure 18:
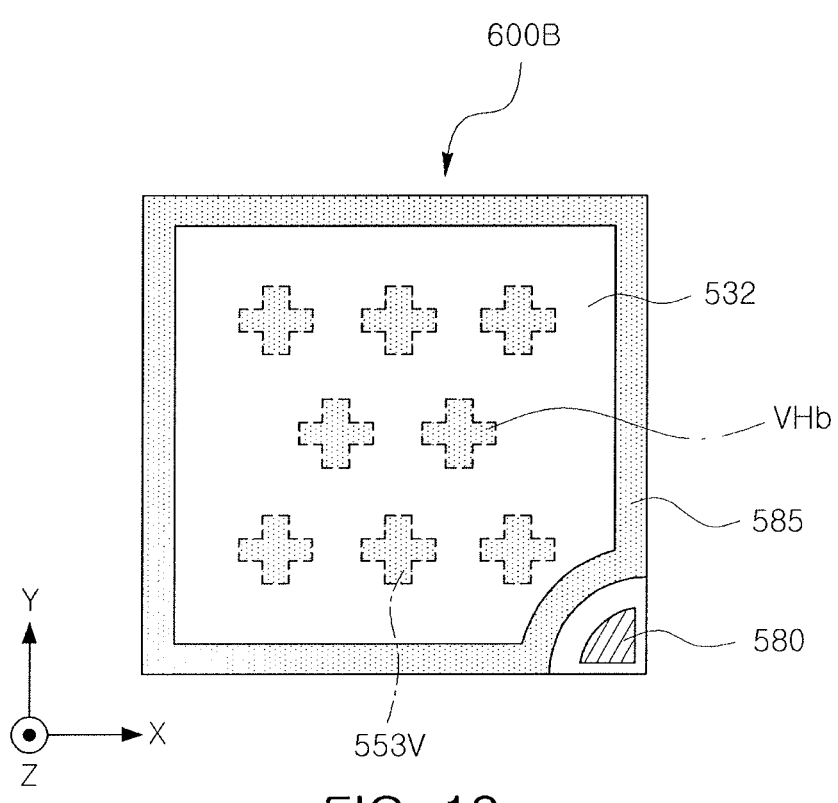

FIGS. 17 through 18 are plan views illustrating semiconductor light emitting devices, according to example embodiments.

Referring to FIG. 17, a semiconductor light emitting device 600A may include the plurality of via holes VHa. The via holes VHa may include first holes extending in a first direction in a plan view (e.g., along the x-axis in FIG. 17), and second holes extending in a second direction in a plan view (e.g., along the y-axis in FIG. 17), intersecting the first direction. The first holes and the second holes may be arranged to have various shapes in rows and columns. For example, as illustrated in FIG. 17, the first holes and the second holes may be alternately disposed in the first direction or the second direction, as described previously with reference to FIG. 10.

Referring to FIG. 18, a semiconductor light emitting device 600B may include the plurality of via holes VHb. The via holes VHb may have a cruciform shape and may be disposed in zigzag form, as described previously with reference to FIG. 11.

As set forth above, according to example embodiments, a semiconductor light emitting device having improved light extraction efficiency may be provided. In particular, the semiconductor light emitting device may include a semiconductor buffer structure capable of reducing the occurrence of cracks in a nitride-based semiconductor thin film, and a light emitting stack including the nitride-based semiconductor thin film formed on the buffer structure. Further, conductive structures including reflective metal, e.g., in vias and trench having sloped sidewalls, may be formed in the light emitting stack to efficiently reflect light emitted horizontally from the active layer of the light emitting stack.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light emitting device, comprising:
a light emitting stack including a first conductive semiconductor layer, an active layer, and a second conductive semiconductor layer;
a plurality of holes through the second conductive semiconductor layer and the active layer, the plurality of holes being adjacent to each other;
a trench extending along an edge of the light emitting stack, the trench extending only along the edge of the light emitting stack and being peripheral with respect to the plurality of holes, the trench extending through the second conductive semiconductor layer and the active layer;
a reflective metal layer within the plurality of holes and within the trench;
an insulating layer between the plurality of holes and the reflective metal layer, and between the trench and the reflective metal layer; and
a first electrode through the insulating layer within the plurality of holes and the trench, the first electrode connecting the reflective metal layer to the first conductive semiconductor layer.

2. The semiconductor light emitting device as claimed in claim 1, wherein the trench extends along four lateral surfaces of the light emitting stack.

3. The semiconductor light emitting device as claimed in claim 1, wherein the plurality of holes includes first holes extending in a first direction, and second holes extending in a second direction intersecting the first direction.

4. The semiconductor light emitting device as claimed in claim 3, wherein the first holes and the second holes are alternately disposed in the first direction or the second direction.

5. The semiconductor light emitting device as claimed in claim 1, wherein the plurality of holes have a cruciform shape, and are disposed in a zigzag form.

6. The semiconductor light emitting device as claimed in claim 1, wherein the plurality of holes have line shapes extending in one direction.

7. The semiconductor light emitting device as claimed in claim 6, wherein the plurality of holes extend in one direction and are connected to the trench.

8. The semiconductor light emitting device as claimed in claim 1, further comprising a conductive support substrate connected to the reflective metal layer.

9. A semiconductor light emitting device, comprising:
a light emitting stack including a first conductive semiconductor layer, an active layer, and a second conductive semiconductor layer;
a plurality of holes through the second conductive semiconductor layer and the active layer, the plurality of holes being adjacent to each other;
a trench extending along an edge of the light emitting stack, the trench extending only along the edge of the light emitting stack and being peripheral with respect to the plurality of holes, the trench extending through the second conductive semiconductor layer and the active layer;
a reflective metal layer within the plurality of holes and within the trench;
an insulating layer between the plurality of holes and the reflective metal layer, and between the trench and the reflective metal layer; and
a first electrode through the insulating layer within the plurality of holes, and connecting the reflective metal layer to the first conductive semiconductor layer,
wherein the reflective metal layer within the trench is electrically insulated from the first conductive semiconductor layer.

10. A semiconductor light emitting device, comprising:
a light emitting stack including a first conductive semiconductor layer, an active layer, and a second conductive semiconductor layer;
a plurality of conductive vias through the second conductive semiconductor layer and the active layer to be connected to the first conductive semiconductor layer; and
a conductive line extending along edges of the light emitting stack, and passing through the second conductive semiconductor layer and the active layer,
wherein conductive line passes only through the second conductive semiconductor layer and the active layer among the first conductive semiconductor layer, the active layer, and the second conductive semiconductor layer, and
wherein the plurality of conductive vias and the conductive line include metallic materials reflecting light emitted from the active layer in a horizontal direction.

11. The semiconductor light emitting device as claimed in claim 10, wherein the conductive line extends along four lateral surfaces of the light emitting stack.

12. The semiconductor light emitting device as claimed in claim 10, wherein the plurality of conductive vias include first conductive vias extending in a first direction, and second conductive vias extending in a second direction intersecting the first direction.

13. The semiconductor light emitting device as claimed in claim 10, wherein the plurality of conductive vias have a crucifoiin shape, and are disposed in a zigzag form.

14. The semiconductor light emitting device as claimed in claim 10, wherein the plurality of conductive vias have line shapes extending in one direction.

15. The semiconductor light emitting device as claimed in claim 10, further comprising first electrodes connecting the plurality of conductive vias and the conductive line to the first conductive semiconductor layer.

* * * * *